(12) United States Patent
Briggs et al.

(10) Patent No.: US 10,192,829 B2
(45) Date of Patent: Jan. 29, 2019

(54) LOW-TEMPERATURE DIFFUSION DOPING OF COPPER INTERCONNECTS INDEPENDENT OF SEED LAYER COMPOSITION

(71) Applicant: International Business Machines Corporation, Armonk, NY (US)

(72) Inventors: Benjamin D. Briggs, Waterford, NY (US); Lawrence A. Clevenger, LaGrangeville, NY (US); Chao-Kun Hu, Somers, NY (US); Takeshi Nogami, Schenectady, NY (US); Deepika Priyadarshini, Guilderland, NY (US); Michael Rizzolo, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/670,387

(22) Filed: Aug. 7, 2017

(65) Prior Publication Data

US 2017/0358533 A1  Dec. 14, 2017

Related U.S. Application Data

(62) Division of application No. 14/862,580, filed on Sep. 23, 2015, now Pat. No. 9,754,891.

(51) Int. Cl.
*H01L 23/522* (2006.01)
*H01L 23/528* (2006.01)
*H01L 23/538* (2006.01)
(Continued)

(52) U.S. Cl.
CPC .... *H01L 23/5386* (2013.01); *H01L 21/76846* (2013.01); *H01L 21/76849* (2013.01);
(Continued)

(58) Field of Classification Search
CPC ............... H01L 23/5386; H01L 23/522; H01L 23/53233; H01L 23/5329; H01L 23/538;
(Continued)

(56) References Cited

U.S. PATENT DOCUMENTS 5,277,985 A   1/1994   Li et al.
5,917,244 A   6/1999   Lee et al.
(Continued)

OTHER PUBLICATIONS

J.R. Lloyd et al., "Electromigration in copper conductors," Thin Solid Films, vol. 262, No. 1, Jun. 1995, pp. 135-141.
R. Gonella, "Key reliability issues for copper integration in damascene architecture," Microelectronic Engineering, vol. 55, No. 1, Mar. 2001, pp. 245-255.
List of IBM Patents or Applications Treated as Related (2 pages).

*Primary Examiner* — Chuong A Luu
(74) *Attorney, Agent, or Firm* — Vazken Alexanian; Michael J. Chang, LLC

(57) ABSTRACT

Low-temperature techniques for doping of Cu interconnects based on interfacially-assisted thermal diffusion are provided. In one aspect, a method of forming doped copper interconnects includes the steps of: patterning at least one trench in a dielectric material; forming a barrier layer lining the trench; forming a metal liner on the barrier layer; depositing a seed layer on the metal liner; plating a Cu fill into the trench to form Cu interconnects; removing a portion of a Cu overburden to access an interface between the metal liner and the Cu fill; depositing a dopant layer; and diffusing a dopant(s) from the dopant layer along the interface to form a Cu interconnect doping layer between the metal liner and the Cu fill. Alternatively, the overburden and the barrier layer/metal liner can be completely removed, and the dopant layer deposited selectively on the Cu fill. An interconnect structure is also provided.

12 Claims, 4 Drawing Sheets

(51) Int. Cl.
*H01L 21/768* (2006.01)
*H01L 23/532* (2006.01)

(52) U.S. Cl.
CPC .. *H01L 21/76858* (2013.01); *H01L 21/76864* (2013.01); *H01L 21/76867* (2013.01); *H01L 21/76871* (2013.01); *H01L 21/76879* (2013.01); *H01L 21/76883* (2013.01); *H01L 21/76886* (2013.01); *H01L 23/5329* (2013.01); *H01L 23/53233* (2013.01); *H01L 23/53238* (2013.01)

(58) Field of Classification Search
CPC ................ H01L 23/532; H01L 23/481; H01L 23/53209; H01L 23/53238; H01L 23/48; H01L 23/5226; H01L 23/53204; H01L 23/53228; H01L 23/53266; H01L 23/5283
USPC ........................................................ 257/751
See application file for complete search history.

(56) References Cited

U.S. PATENT DOCUMENTS

| | | |
|---|---|---|
| 6,355,983 B2 | 3/2002 | Graas et al. |
| 6,800,554 B2 | 10/2004 | Marieb et al. |
| 6,979,642 B1 | 12/2005 | Buynoski et al. |
| 7,199,052 B2 | 4/2007 | Cohen |
| 8,492,289 B2 | 7/2013 | Edelstein et al. |
| 8,729,702 B1 | 5/2014 | Niu et al. |
| 2008/0296768 A1 | 12/2008 | Chebiam et al. |
| 2010/0200991 A1* | 8/2010 | Akolkar .............. H01L 21/2855 257/751 |
| 2011/0045171 A1 | 2/2011 | McFeely et al. |
| 2012/0061838 A1 | 3/2012 | Edelstein et al. |
| 2014/0061918 A1* | 3/2014 | Jezewski ............. H01L 21/2855 257/751 |

* cited by examiner

LOW-TEMPERATURE DIFFUSION DOPING OF COPPER INTERCONNECTS INDEPENDENT OF SEED LAYER COMPOSITION

CROSS-REFERENCE TO RELATED APPLICATION(S)

This application is a divisional of U.S. application Ser. No. 14/862,580 filed on Sep. 23, 2015, now U.S. Pat. No. 9,754,891, the disclosure of which is incorporated by reference herein.

FIELD OF THE INVENTION

The present invention relates to forming copper (Cu) interconnects, and more particularly, to low-temperature techniques for doping of Cu interconnects based on interfacially-assisted thermal diffusion.

BACKGROUND OF THE INVENTION

Conventional methods of doping copper (Cu) interconnects by doping a Cu seed layer has potential limitations due to thickness requirements, doping levels, conformality, and fill performance. All of these metrics can change depending on the dopant concentration in the seed target.

Further, the thermal diffusion of alloys into trenches has typically been done at higher temperatures (e.g., above 200° C.). However, at narrow dimensions (e.g., below a 36 nanometer (nm) trench width) the via structures degrade at such higher temperatures due to stress migration—especially if no copper overburden remains.

Therefore, improved techniques for forming doped Cu interconnects are needed.

SUMMARY OF THE INVENTION

The present invention provides to low-temperature techniques for doping of copper (Cu) interconnects based on interfacially-assisted thermal diffusion. In one aspect of the invention, a method of forming doped Cu interconnects is provided. The method includes the steps of: patterning at least one trench in a dielectric material; forming a barrier layer lining the trench and covering a top surface of the dielectric material; forming a metal liner on the barrier layer; depositing a Cu-containing seed layer on the metal liner; plating a Cu fill into and overfilling the trench to form Cu interconnects; removing a portion of a Cu overburden above the trench to access an interface between the metal liner and the Cu fill; depositing a dopant layer on a top surface of the metal liner and the Cu fill; and diffusing at least one dopant from the dopant layer along the interface between the metal liner and the Cu fill to form a Cu interconnect doping layer between the metal liner and the Cu fill.

In another aspect of the invention, another method of forming doped Cu interconnects is provided. The method includes the steps of patterning at least one trench in a dielectric material; forming a barrier layer lining the trench and covering a top surface of the dielectric material; forming a metal liner on the barrier layer; depositing a Cu-containing seed layer on the metal liner; plating a Cu fill into and overfilling the trench to form Cu interconnects; fully removing a Cu overburden above the trench; removing the barrier layer and metal liner from the top surface of the dielectric material to access an interface between the metal liner and the Cu fill; selectively depositing a dopant layer on only a top surface of the Cu fill without depositing on the dielectric material; and diffusing at least one dopant from the dopant layer along the interface between the metal liner and the Cu fill to form a Cu interconnect doping layer between the metal liner and the Cu fill.

In yet another aspect of the invention, an interconnect structure is provided. The interconnect structure includes: at least one trench patterned in a dielectric material; a barrier layer lining the trench; a metal liner on the barrier layer, wherein the metal liner includes Ru or Co; a Cu interconnect doping layer on the metal liner, wherein the Cu interconnect doping layer includes at least one dopant selected from the group consisting of: Ni, Co, Mn, and combinations thereof; and a Cu interconnect in the trench such that the Cu interconnect doping layer is present between the metal liner and the Cu interconnect.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for diffusion doping of copper (Cu) interconnects. As will be described in detail below, the present techniques involve use of an interfacially-assisted thermal diffusion of a dopant primarily along the Cu/liner interface. Advantageously, this process can be performed at low temperatures (e.g., below 200° C.) thereby avoiding damage to the via structure. Further, the present techniques permit variable doping levels regardless of the Cu seed target composition (allowing for pure Cu seed) by depositing a thin layer of the dopant above the trench after a partial polish of the Cu fill, and then thermally diffusing the dopant along the liner material (at a low temperature).

Several different embodiments of the present techniques are now presented. The various embodiments differ primarily based on the particular metal liner and dopant materials being employed. For instance, the process flow of the present techniques generally proceeds as follows. At least one trench is patterned in a suitable dielectric. A barrier layer is formed lining the trench(es). A metal liner layer is deposited onto the barrier layer. A copper-containing fill metal is deposited into and filling the trenches. Either a partial or full polish of the Cu overburden is performed to access the Cu/metal liner interface. A dopant material is then introduced along that Cu/metal liner interface via thermal diffusion. In one exemplary embodiment, the metal liner is cobalt (Co), and the dopant (e.g., nickel (Ni)) is introduced via the deposition of a dopant layer across the top surface of the Cu and dielectric structure, followed by a diffusion anneal to introduce the dopant to the Cu/metal liner interface. Similar to this first embodiment, in a second exemplary embodiment, a ruthenium (Ru) metal liner is employed and the same basic process is performed except that following the diffusion anneal, the dopant is homogenized from the interface into the Cu. With this configuration, the dopant can react/alloy with the liner material to improve material properties, alter interfacial diffusion, and enhance liner stability. In the case of the Ru liner, however, it is expected that no such alloying/reaction would occur so the dopant will be free to homogenize into the Cu or diffuse through the barrier to react with the dielectric.

In a third exemplary embodiment presented herein, a Ru metal liner is employed in conjunction with a Co dopant. In that case, a full polish of the Cu is carried out to permit the Co dopant to be deposited only on the metal (i.e., Cu) and not on the dielectric. This precise placement of the dopant will permit the interfacially-assisted thermal diffusion of the dopant along the Cu/liner interface during additional level builds.

The first two exemplary embodiments will now be described by way of reference to FIGS. 1-7. The third exemplary embodiment will be described below by way of reference to FIGS. 8-10.

Figure 1:
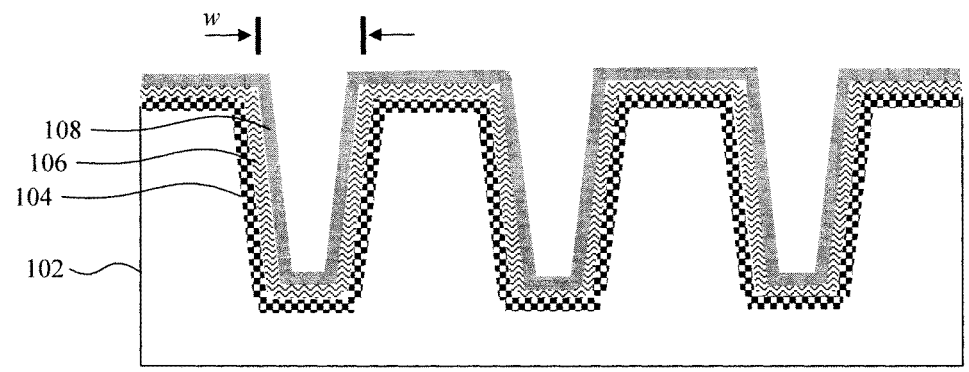
FIG. 1 is a cross-sectional diagram illustrating one or more trenches having been patterned in a dielectric material, and a barrier layer, a metal liner, and a copper (Cu) or Cu alloy seed layer having been deposited into the trenches according to an embodiment of the present invention.

As shown in FIG. 1, the process begins with one or more trenches being patterned in a dielectric material 102. Suitable dielectric materials include, but are not limited to, silsesquioxanes, carbon doped oxides (i.e., organosilicates) that include atoms of silicon (Si), carbon (C), oxygen (O) and hydrogen (H), thermosetting polyarylene ethers, or multi-layers thereof. The term "polyarylene," as used herein, denotes aryl moieties or inertly substituted aryl moieties which are linked together by bonds, fused rings, or inert linking groups such as, for example, oxygen, sulfur, sulfone, sulfoxide, carbonyl and the like.

As provided above, one challenge with conventional processes of doping Cu interconnects is that the high temperatures employed can damage narrow features. Advantageously, the present techniques provide a low temperature process (e.g., temperatures less than 200° C.) that can be used for forming interconnect structures with scaled dimensions and without damage. Thus, according to an exemplary embodiment, the trenches patterned in the dielectric material have a width w (see FIG. 1) of less than about 50 nanometers (nm), e.g., from about 10 nm to about 40 nm, and ranges therebetween.

Next, a barrier layer 104 is formed lining the trenches, and covering a top surface of the dielectric material 102. See FIG. 1. According to an exemplary embodiment, the barrier layer 104 is formed from a conventional tantalum (Ta) and/or tantalum nitride (TaN) film.

A metal liner 106 is next deposited onto the barrier layer 104. According to an exemplary embodiment, the metal liner 106 contains Ru or Co. By way of example only, the metal liner may be deposited as a conformal layer on the barrier layer 104 using a deposition process such as chemical vapor deposition or CVD, ionized physical vapor deposition (I-PVD), etc.

Next, a Cu-containing seed layer 108 is deposited onto the metal liner 106. See FIG. 1. As is known in the art, a seed layer assists in the electroplating of Cu into the interconnect. Seed layer 108 can contain pure Cu, or a Cu alloy such as a Cu manganese (Mn) alloy. According to an exemplary embodiment, the seed layer 108 contains pure Cu.

Figure 2:
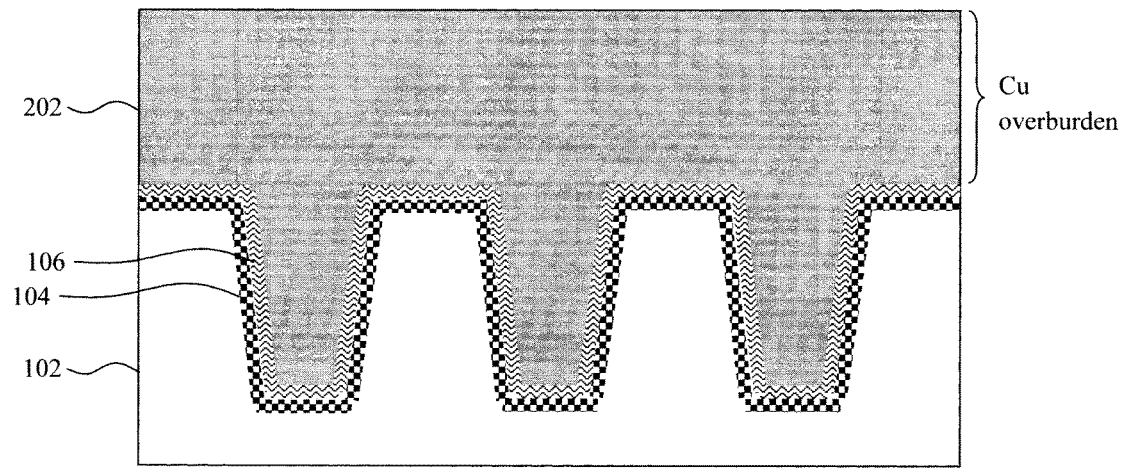
FIG. 2 is a cross-sectional diagram illustrating a Cu fill having been electroplated into, and overfilling, the trenches according to an embodiment of the present invention.

A Cu fill 202 is then electroplated into the trenches. See FIG. 2. As shown in FIG. 2, the electroplated Cu will overfill the trenches. The portion of the Cu that is present above the dielectric material 102 is also referred to herein as the overburden. After electroplating the Cu seed layer is indistinguishable from the Cu fill 202.

Figure 3:
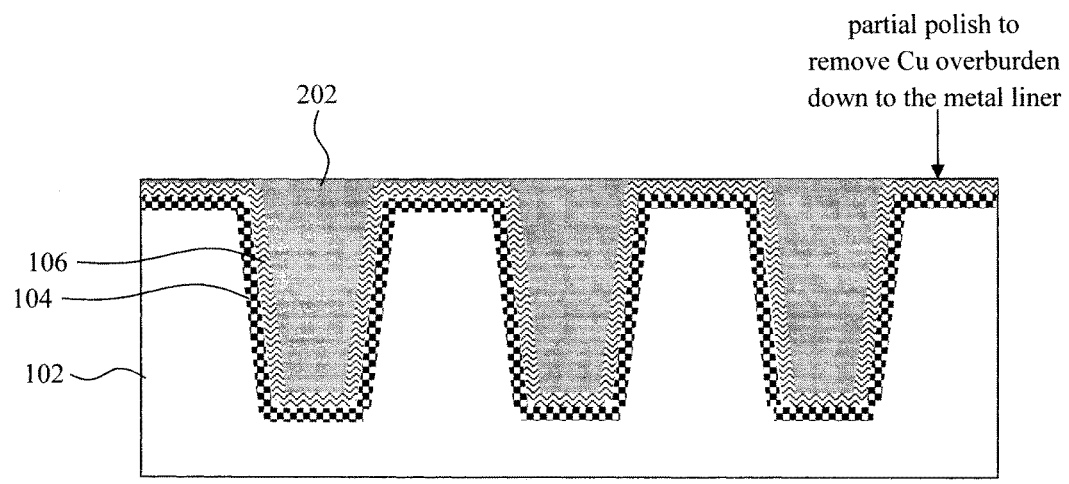
FIG. 3 is a cross-sectional diagram illustrating a partial polish having been performed to remove the Cu overburden down to the metal liner and thereby exposing the Cu fill/metal liner interface according to an embodiment of the present invention.
Figure 4:
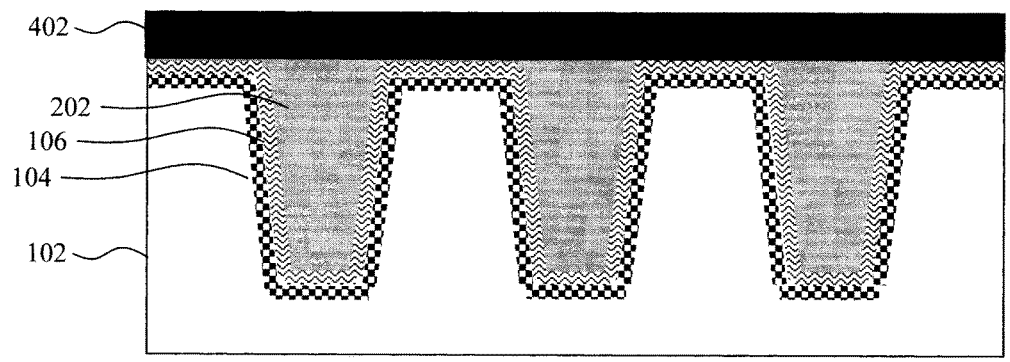
FIG. 4 is a cross-sectional diagram illustrating a dopant layer having been (blanket) deposited onto the top surfaces of the metal liner and Cu fill according to an embodiment of the present invention.
Figure 5:
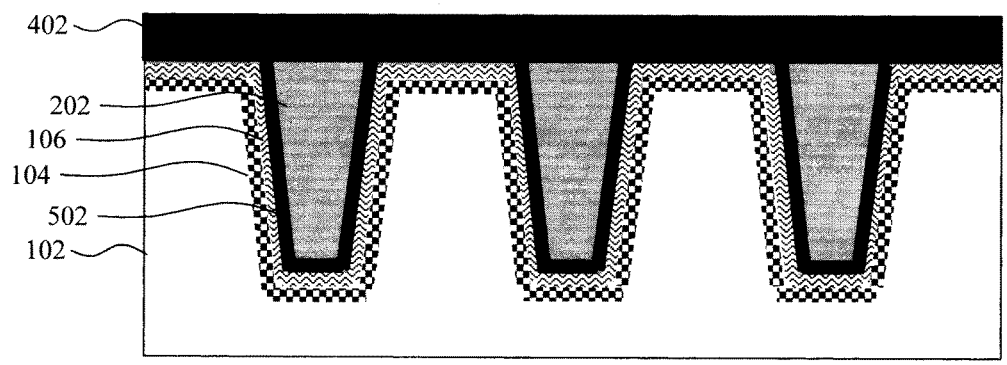
FIG. 5 is a cross-sectional diagram illustrating an interfacially-assisted, low temperature thermal diffusion having been used to form a dopant layer in between the metal liner and the Cu fill according to an embodiment of the present invention.
Figure 6:
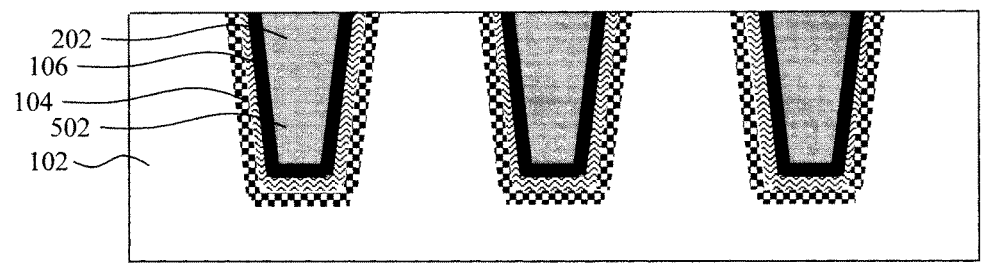
FIG. 6 is a cross-sectional diagram illustrating the remaining portion of the dopant layer, as well as the metal liner and barrier layer having been removed from the top surfaces of the dielectric material and the Cu fill according to an embodiment of the present invention.

A partial polish is next performed to remove the Cu overburden down to the metal liner 106. By "partial" it is meant that only a portion of the Cu overburden is removed in this step. Namely, an additional polishing will need to be performed to reach the target trench height (see below). The goal here is to access the interface between the metal liner 106 and the Cu fill 202 which can be accomplished by polishing the Cu overburden down to the metal liner 106 as shown in FIG. 3. One or more additional polishing steps may be needed to fully polish the interconnect and remove the metal liner 106, barrier layer 104, etc. from the top of the dielectric material 102. Thus, one may simply employ the first of a multi-step polishing process to, in this example, partially etch the Cu overburden. While access to the interface between the metal liner 106 and the Cu fill 202 can be accomplished by exposing the interface via polishing, it is notable that dopants can be introduced to the interface even if it is not exposed per se. The present techniques merely require that the dopant can reach the interface relatively quickly (to reach the fast diffusion pathway). Therefore, even if (post-polishing) there remains from about 1 nm to about 5 nm, and ranges therebetween of Cu in between the dopant layer and the interface, the dopant would still reach the interface and fast diffuse as needed. Thus when mention is made herein to accessing the interface, this includes scenarios where the interface is exposed as well as instances where a small portion of Cu (e.g., from about 1 nm to about 5 nm) is left between the dopant layer and the interface.

A dopant layer 402 is next deposited onto the top surfaces of the (now-exposed) metal liner 106 and Cu fill 202. See FIG. 4. By way of example only, dopant layer 402 includes a metallic dopant(s) selected from the group consisting of: Ni, Co, Mn, and combinations thereof. According to an exemplary embodiment, the dopant layer 402 is formed from Ni. In this exemplary embodiment, the dopant layer 402 is formed as a blanket layer on the structure. As highlighted above and as will be described in detail below, embodiments are presented herein where the dopant is deposited on only the Cu fill surfaces (and not on the dielectric). That alternative embodiment permits the building of additional layers and diffusion of the dopant during subsequent processing.

The metal liner 106/Cu fill 202 interface provides a pathway for fast diffusion of the dopant(s) from the dopant layer 402. Namely, diffusion of the dopants from layer 402 occurs at a faster rate along the metal liner 106/Cu fill 202 interface than, e.g., through the bulk of the Cu fill 202. This is what is referred to herein as interfacially-assisted diffusion which, advantageously, permits the present dopant diffusion anneal to be performed at low temperatures. As a result of the interfacially-assisted, low temperature thermal diffusion, a layer 502 of the dopant (i.e., a Cu interconnect doping layer) is formed in between the metal liner 106 and the Cu fill 202. See FIG. 5.

Specifically, the thermal diffusion is carried out by annealing the Cu interconnect structure under conditions sufficient to diffuse the dopant(s) from the dopant layer 402 along the interface between the metal liner 106 and the Cu fill 202 to form the dopant layer 502 between the metal liner 106 and the Cu fill 202. According to an exemplary embodiment, the conditions include a temperature of from about 50° C. to about 200° C., and ranges therebetween, for a duration of from about 3 hours to about 10 minutes, and ranges therebetween.

Following the dopant diffusion, the remaining portion of the dopant layer 402, as well as the metal liner 106, barrier layer 104, etc. can be removed from the top surfaces of the dielectric material 102 and Cu fill 202—if so desired. See FIG. 6. All of the polishing steps may be performed herein using standard techniques, such as chemical mechanical polishing or CMP.

Figure 7:
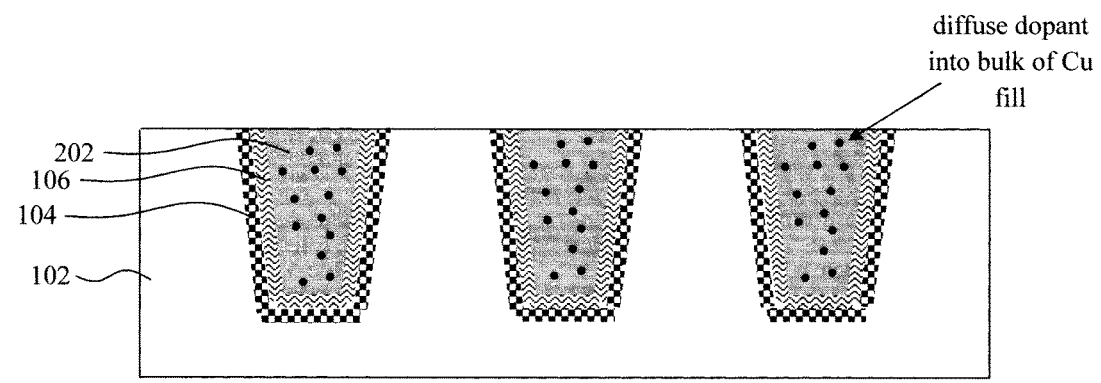
FIG. 7 is a cross-sectional diagram illustrating the dopant having been optionally diffused into the bulk of the Cu fill according to an embodiment of the present invention.

As provided above, the process may vary depending on the particular metal liner materials. For instance, as described above, dopants such as Ni can serve to stabilize a Co metal liner material. Thus, when the metal liner 106 includes Co, it may be desirable to leave the dopant layer 502 intact at the interface between the metal liner 106 and the Cu fill 202 in order to prevent the Co from undesirably diffusing into the Cu fill 202. On the other hand, there are not the same concerns with Ru, which is a more stable molecule. Thus, when the metal liner 106 includes Ru, one may optionally diffuse the dopant from the interface into the Cu fill 202 (i.e., the dopant is diffused from dopant layer 502 into the bulk of the Cu fill 202). See FIG. 7. As shown in FIG. 7, post-diffusion, the dopant layer 502 is no longer present at the interface between the metal liner 106 and the Cu fill 202. It is notable that diffusion of the dopant into the Cu fill can occur naturally with the subsequent processing at higher temperatures in semiconductor fabrication. An advantage to diffusing the dopant into the Cu fill may be that forming a bulk alloy rather than just influencing the interfaces could help electromigration if the interfaces are sufficiently slow to electromigration.

As highlighted above, in another exemplary embodiment, rather than depositing a blanket dopant layer and then having to polish away the excess, one can instead deposit the dopant layer selectively on the Cu fill. This alternative embodiment is now described. The starting structure is the same, i.e., one or more trenches patterned in the dielectric material 102, the trenches lined with a barrier layer 104, a metal liner 106, and then a Cu fill 202. See, for example, FIGS. 1 and 2. As provided above, suitable metal liner materials include, but are not limited to, Co and Ru. According to an exemplary embodiment, the metal liner 106 in this example contains Ru.

Figure 8:
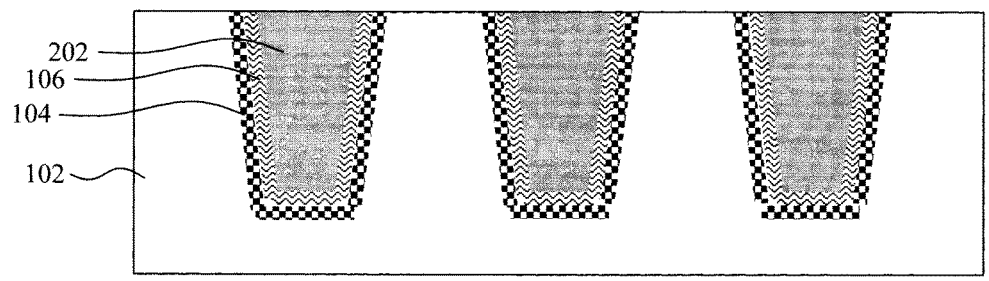
FIG. 8 is a cross-sectional diagram illustrating, according to an alternative embodiment, a full polish of the barrier layer, the metal liner, and the Cu fill down to the top surface of the dielectric material having been performed which serves to expose the metal liner/Cu fill interface according to an embodiment of the present invention.

In the example provided above, a partial polish of the Cu fill 202 was next performed. In this case, however, it is preferable to perform a full polish of the barrier layer 104, the metal liner 106, and the Cu fill 202 down to the top surface of the dielectric material 102. See FIG. 8 which, in this example, follows from FIG. 2. A full polish (i.e., to the target trench height) is preferable at this stage since no further polishing or etching will be performed post-deposition of the dopant layer. As shown in FIG. 8, this full polishing step serves to access the metal liner 106/Cu fill 202 interface. As described above, by 'access' it is meant that the interface is exposed or that only a small portion of the Cu (e.g., about 1 nm to about 5 nm, and ranges therebetween) remains in between the dopant layer and the interface. As provided above, a full polish may involve multiple etching/polishing steps to remove the various layers. For instance, a first polishing step may be performed to remove the Cu overburden, followed by a next polishing step to remove the metal liner, and a third directed to the barrier layer, and so on.

A dopant layer 902 is next formed selectively on the exposed top surfaces of the Cu fill 202. See FIG. 9. As provided above, suitable dopants include, but are not limited to, Ni, Co, Mn, and combinations thereof. According to an exemplary embodiment, the dopant layer 902 includes Co. Techniques for forming a metal cap on a metal wiring structure selective to a surrounding dielectric are described, for example, in U.S. Patent Application Publication Number 2011/0045171 by McFeely et al., entitled "Multi-step Method to Selectively Deposit Ruthenium Layers of Arbitrary Thickness on Copper," the contents of which are incorporated by reference as if fully set forth herein.

As described above, the metal liner 106/Cu fill 202 interface provides a pathway for fast diffusion of the dopant(s) from the dopant layer 902 such that diffusion of the dopants from layer 902 occurs at a faster rate along the metal liner 106/Cu fill 202 interface than, e.g., through the bulk of the Cu fill 202. As a result of this interfacially-assisted diffusion, the present dopant diffusion anneal to form a layer 1002 of the dopant (i.e., a Cu interconnect doping layer) in between the metal liner 106 and the Cu fill 202 can be performed at low temperatures. See FIG. 10.

Namely, the thermal diffusion is carried out by annealing the Cu interconnect structure under conditions sufficient to diffuse the dopant(s) from the dopant layer 902 along the interface between the metal liner 106 and the Cu fill 202 to form the dopant layer 1002 between the metal liner 106 and the Cu fill 202. As provided above, suitable conditions include, but are not limited to, a temperature of from about 50° C. to about 200° C., and ranges therebetween, for a duration of from about 3 hours to about 10 minutes, and ranges therebetween.

Figure 9:
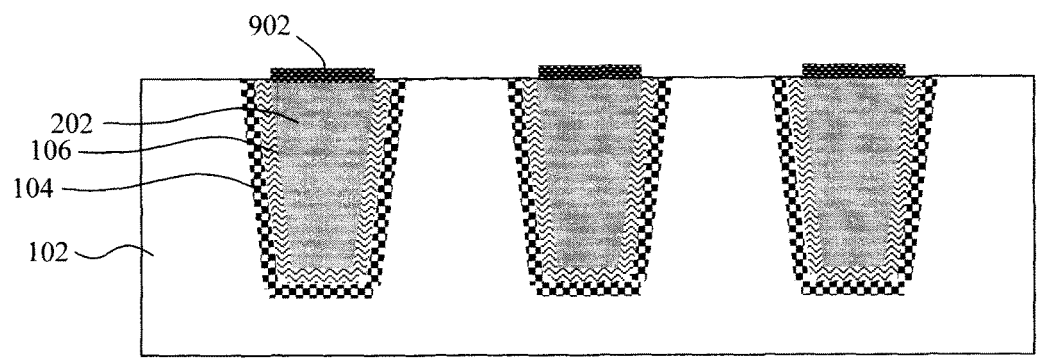
FIG. 9 is a cross-sectional diagram illustrating a dopant layer having been formed selectively on the exposed top surfaces of the Cu fill according to an embodiment of the present invention.
Figure 10:
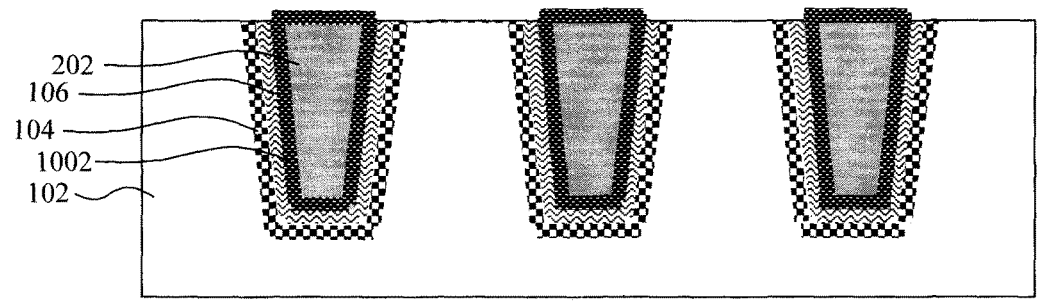
FIG. 10 is a cross-sectional diagram illustrating an interfacially-assisted, low temperature thermal diffusion having been used to form a dopant layer in between the metal liner and the Cu fill according to an embodiment of the present invention.

Advantageously, since a full polish was already performed to completely remove the Cu overburden and the barrier and metal liner from over the dielectric material, one may optionally selectively place the dopant layer 902 on the exposed top surfaces of the Cu fill 202 (as shown in FIG. 9)

and then next move on to building additional levels. During the additional level builds, the dopant(s) from layer 902 will diffuse along the interface. For instance, once a metal level is finished, it can be capped, a blanket dielectric can be deposited, and more lines/vias can be patterned and formed above the original 'level.' In doing those depositions and processes, everything below is heated which serves to diffuse the dopants.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. An interconnect structure, comprising:
   at least one trench patterned in a dielectric material;
   a barrier layer lining the trench;
   a metal liner on the barrier layer;
   a copper (Cu) interconnect doping layer on the metal liner; and
   a Cu interconnect in the trench such that the Cu interconnect doping layer is present between the metal liner and the Cu interconnect, wherein the Cu interconnect doping layer fully surrounds the Cu interconnect whereby the Cu interconnect doping layer is continuous along all bottom, sidewall and top surfaces of the Cu interconnect.

2. The interconnect structure of claim 1, wherein the metal liner comprises ruthenium (Ru).

3. The interconnect structure of claim 1, wherein the metal liner comprises ruthenium cobalt (Co).

4. The interconnect structure of claim 1, wherein the metal liner is disposed as a conformal layer on the barrier layer.

5. The interconnect structure of claim 1, wherein the Cu interconnect doping layer comprises at least one dopant selected from the group consisting of: nickel (Ni), Co, manganese (Mn), and combinations thereof.

6. The interconnect structure of claim 1, wherein the Cu interconnect doping layer comprises Ni.

7. The interconnect structure of claim 1, wherein the trench has a width of less than about 50 nm.

8. The interconnect structure of claim 1, wherein the trench has a width of from about 10 nm to about 40 nm, and ranges therebetween.

9. The interconnect structure of claim 1, wherein the dielectric material is selected from the group consisting of: silsesquioxanes, carbon doped oxides that include atoms of silicon (Si), carbon (C), oxygen (O) and hydrogen (H), thermosetting polyarylene ethers, and combinations thereof.

10. The interconnect structure of claim 1, wherein the barrier layer comprises at least one of tantalum (Ta) and tantalum nitride (TaN).

11. The interconnect structure of claim 1, wherein the Cu interconnect doping layer is absent from a top surface of the dielectric material.

12. The interconnect structure of claim 1, wherein a top surface of the Cu interconnect is coplanar with a top surface of the dielectric material.

* * * * *